United States Patent
Kim et al.

[11] Patent Number: 6,087,278
[45] Date of Patent: Jul. 11, 2000

[54] METHOD FOR FABRICATING SEMICONDUCTOR DEVICES HAVING AN HDP-CVD OXIDE LAYER AS A PASSIVATION LAYER

[75] Inventors: Sun Oo Kim; Han Min Kim, both of Ichon, Rep. of Korea

[73] Assignee: Hyundai Electronics Industries Co., Ltd., Ichon, Rep. of Korea

[21] Appl. No.: 09/327,678

[22] Filed: Jun. 8, 1999

[30] Foreign Application Priority Data

Jun. 16, 1998 [KR] Rep. of Korea ............... 98-22478

[51] Int. Cl.[7] ............................................. H07L 21/00
[52] U.S. Cl. ..................... 438/978; 438/666; 438/667; 438/668; 438/672; 438/673
[58] Field of Search ........................ 438/672, 673, 438/666, 667, 668, 978

[56] References Cited

U.S. PATENT DOCUMENTS

| | | | |
|---|---|---|---|
| 5,094,900 | 3/1992 | Langley | 438/131 |
| 5,621,241 | 4/1997 | Jain | 257/632 |
| 5,721,173 | 2/1998 | Yano et al. . | |
| 5,728,621 | 3/1998 | Zheng et al. . | |
| 5,759,906 | 6/1998 | Lou . | |
| 5,789,315 | 8/1998 | Besser et al. . | |
| 5,814,564 | 9/1998 | Yao et al. | 438/723 |
| 5,851,899 | 12/1998 | Weigand . | |

FOREIGN PATENT DOCUMENTS

| | | |
|---|---|---|
| 7-263572 | 10/1995 | Japan . |
| 9-266207 | 10/1997 | Japan . |
| 10-116826 | 5/1998 | Japan . |
| 10-135456 | 5/1998 | Japan . |

OTHER PUBLICATIONS

Redeker Fred C et al., "Plasma Source For HDP–CVD Chamber", Patent Abstracts of Japan, Application No. 10028509, filed Feb. 10, 1998.

*Primary Examiner*—Charles Bowers
*Assistant Examiner*—Lisa Kilday
*Attorney, Agent, or Firm*—Jacobson, Price, Holman & Stern, PLLC

[57] ABSTRACT

There is provided a method for fabricating a semiconductor device, by which passivation layers are formed with good step coverage to prevent crack or void from being occurred in high aspect ratio of metallization layers and the time for performing the processes can be decreased to enhance the productability and the yield of the device. The method is performed as follows. Over a substrate having completed metallization layers, an oxide layer is formed as a first passivation layer by high-density plasma chemical vapor deposition (HDP-CVD). On the HDP-CVD oxide layer, a nitride layer is formed as a second passivation layer by plasma enhanced chemical vapor deposition (PECVD) or HDP-CVD.

16 Claims, 3 Drawing Sheets

FIG. 5

| YIELD AND STEP<br>CASE | PACKAGE-BEFORE STEP | PRODUCT RELEASING STEP AFTER COMPLETION OF PACKAGE | EXAMINATION FOR RELIABILITY |
|---|---|---|---|
| THE INVENTION | 78.33% | 85.71% | PASSED |
| THE PRIOR ART | 76.76% | 79.15% | PASSED |

METHOD FOR FABRICATING SEMICONDUCTOR DEVICES HAVING AN HDP-CVD OXIDE LAYER AS A PASSIVATION LAYER

1. Field of the Invention

The present invention relates to methods for fabricating semiconductor devices; and, more particularly, to methods for high-integrated memory devices having passivation layers.

2. Description of the Prior Art

Generally, in manufacture of a memory device of a semiconductor device, a passivation layer or passivation layers are formed to protect the internal elements after completion of metallization. The passivation layers are typically formed with deposition of an oxide layer and a nitride layer. Here, the oxide layer and the nitride layer are formed by plasma enhanced chemical vapor deposition (PECVD), respectively.

However, there are the following problems in the method of the art, in which passivation layers are consisted of the oxide layer formed by plasma enhanced chemical vapor deposition (hereinafter, simply referred as "PECVD oxide layer") and the nitride layer formed by plasma enhanced chemical vapor deposition (hereinafter, simply referred as "PECVD nitride layer").

With the trend of high integration of memory devices, the distance between the metallization layers becomes short. The PECVD oxide layer and the PECVD nitride layer can not be sufficiently filled in the space between the metallization layers due to their property of step coverage, thereby allowing cracks generated. The step coverage of the layers is not good enough to perform gap-fill task effectively in the manufacture of higher integrated memory devices.

FIG. 1 is a SEM picture showing the state of a semiconductor device with passivation layers according to the prior art. Referring to the drawing, metallization layers 12 are completed in pursuit of the common CMOS processes. A PECVD oxide layer 13 and a PECVD nitride layer 14 are, in turn, deposited over the entire substrate structure. The step coverage may be the worst at the bottom portions of sidewalls of the metal layers, thereby, cracks being greatly produced at the bottom portions as shown in the drawing.

SUMMARY OF THE INVENTION

It is, therefore, an object of the present invention to provide a method for fabricating a semiconductor device with passivation layers having good step coverage in high aspect ratio.

It is another object of the present invention to provide a method for fabricating a semiconductor device by which the time period for forming passivation layers of a semiconductor device can be decreased to enhance the productability, the compression stress of the oxide layer can be maximally suppressed to increase the yield of the semiconductor device, and the generation of void can be suppressed under the passivation layers.

As well known, the high-density plasma chemical vapor deposition (HDP-CVD) is performed with high-density plasma consisting of the number of ion (electron) of $10^{11}$~$10^{12}$/cm$^2$ under a chamber pressure of several mTorr. The high-density plasma is formed from source gases of the deposited thin film and inert gas in the chamber. The deposited film is partially etched by plasma of the inert gas with its deposition. The gap-filling property of the deposited film is excellent because deposition and etching are simultaneously occurred. Therefore, the insulating layer formed by HDP-CVD is applied as an interlayer insulating layer to manufacture of a semiconductor memory device.

The present invention is, thus, to solve the problems of the prior art as described above by forming passivation layer(s) excellent in gap-filling property with HDP-CVD method.

In accordance with an embodiment of the present invention, there is provided a method for fabricating a semiconductor device, which comprises the steps of: preparing a substrate with completion of metallization; forming an oxide layer as a first passivation layer over the substrate by high-density plasma chemical vapor deposition (HDP-CVD); and forming a nitride layer as a second passivation layer on the oxide layer by plasma enhanced chemical vapor deposition (PECVD).

In accordance with another embodiment of the present invention, there is also provided a method for fabricating a semiconductor device, which comprises the steps of: preparing a substrate with completion of metallization; forming an oxide layer as a first passivation layer over the substrate by high-density plasma chemical vapor deposition (HDP-CVD); and forming a nitride layer as a second passivation layer on the oxide layer by high density plasma chemical vapor deposition (HDP-CVD).

In accordance with another embodiment of the present invention, there is also provided a method for fabricating a semiconductor device, which comprises the steps of: preparing a substrate with completion of metallization; forming an oxide layer as a first passivation layer over the substrate by high-density plasma chemical vapor deposition (HDP-CVD); and forming an oxy-nitride layer as a second passivation layer on the oxide layer by high-density plasma chemical vapor deposition (HDP-CVD).

BRIEF DESCRIPTION OF THE DRAWINGS

The above and other objects and features of the present invention will become apparent from the following description of preferred embodiments given in conjunction with the accompanying drawings, in which:

FIG. 5 is a table comparing the yield of the present invention with that of the prior art;

DETAILED DESCRIPTION OF THE PREFERRED EMBODIMENTS

The invention will be illustrated in detail by the following preferred embodiment with reference to the accompanying drawings.

In this embodiment of the invention, an oxide layer formed by high-density plasma chemical vapor deposition (simply referred as "HDP-CVD oxide layer") is applied as a first passivation layer over a substrate and a nitride layer formed by plasma enhanced chemical vapor deposition (simply referred as "PECVD nitride layer") is applied as a second passivation layer on the first passivation layer. The HDP-CVD oxide layer is formed with a thickness of 70~90% or 110~130% based on the height (thickness) of a metallization layer.

Figure 2:
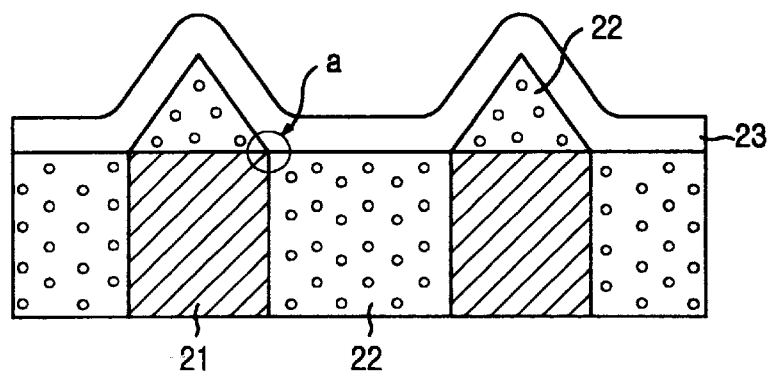
FIGS. 2 to 4 are schematic sectional views of the semiconductor device of the first embodiment of the present invention according to the deposition thickness of the HDP-CVD oxide layer.
Figure 3:
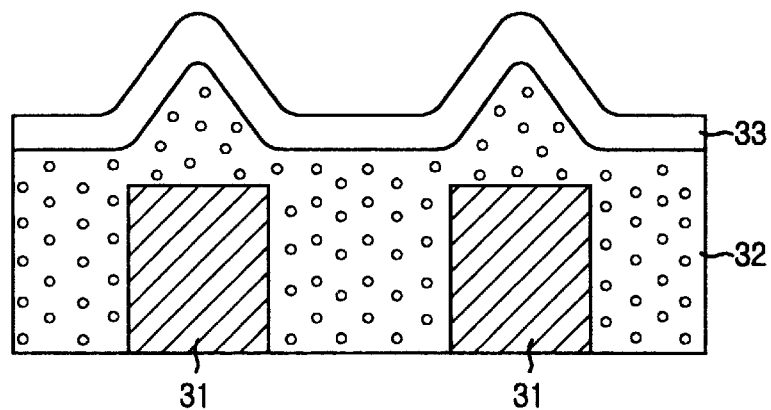
Figure 4:
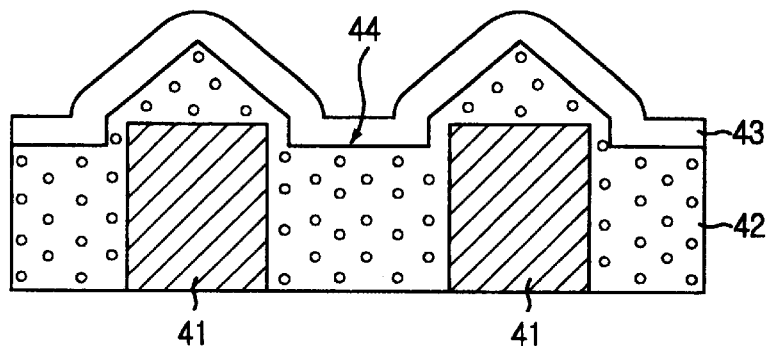

FIGS. 2 to 4 are schematic sectional views of the semiconductor device of the first embodiment of the present invention according to the deposition thickness of the HDP-CVD oxide layer.

At first, FIG. 2 is a schematic sectional view showing the state that an HDP-CVD oxide layer 22 is deposited with the same thickness as the height of a metallization layer 21 and a PECVD nitride layer 23 is deposited on the HDP-CVD oxide layer. As shown in FIG. 2, the HDP-CVD oxide layer is the thinnest at the upper edge portions of the metallization layer 21 ('a' portion in FIG. 2). Such a phenomenon results from partial etching being occurred simultaneously with deposition of the HDP-CVD oxide layer.

After all, if the HDP-CVD oxide layer 22 is deposited with the same thickness as the height of the metallization layer 21, the oxide layer becomes very thin at the upper edge portions of the metallization layer 21 and the deposited PECVD nitride layer 23 is bent at these portions ('a' portion in FIG. 2), thereby, breakdown or deformation is easily occurred by external impact.

Therefore, in one of the first embodiment of the invention, the HDP-CVD oxide layer 32 is deposited with a thickness of 110~130% based on the height of the metallization layer 31 as shown in FIG. 3. By this, the HDP-CVD oxide layer 32 is not very bent at 'a' portion in FIG. 2. Accordingly, the step coverage may be enhanced though the PECVD nitride layer 33 is deposited on the HDP-CVD oxide layer 32.

Also, in the other of the first embodiment of the invention, the HDP-CVD oxide layer 42 may be deposition with a thickness of 70~90% based on the height of the metallization layer 41 as shown in FIG. 4. Here, the chamber pressure is lowly maintained to a pressure of 1~10 mTorr to increase the straight forwarding property of the deposited plasma ions, thereby greatly to enhance the bottom coverage so that it becomes much more larger than the side-wall coverage. By this, the HDP-CVD oxide layer is deposited to form wide shallow hollow 44 at the upper space between the matallation layers. Accordingly, when the PECVD nitride layer 43 is deposited on the HDP-CVD oxide layer 42, its step coverage becomes good on all surfaces of the HDP-CVD oxide layer 42 including the hollow 44 and the occurrence of void can be suppressed under the passivation layers.

The HDP-CVD oxide layer has stronger endurance to physical impact than the PECVD oxide layer. Therefore, it is preferable that PECVD nitride layer should be deposited with a thickness of 2000~5000 Å (compared with a thickness of 5000 Å typically applied to the prior art).

Especially, in a case of flash memory device, it should be exposed to ultra-violet ray for initiation after completion of its manufacture. The PECVD nitride layer 43 should be modified and capable of penetrating the ultra-violet ray. Therefore, the PECVD nitride layer should be excellent in the penetration property for the ultra-violet ray when it is applied to the flash memory device. It is preferable that the PECVD nitride layer should have the penetration of more than 70% based on the amount of ultra-violet ray penetration of the same thick silicon oxide layer.

FIG. 5 shows the enhanced yield of the present invention compared with that of the prior art in case of the first embodiment of the invention applied to 64M synchronous DRAM.

Meanwhile, an HDP-CVD performing device is different with a PECVD performing device and thus, time delay essentially occur at the time of subsequent deposition of the HDP-CVD oxide layer and PECVD nitride layer. Therefore, it is preferable that the processes are continuously performed with cluster type equipment such as multi-chamber or multi-processes equipment, which is in the form of incorporated type and is capable of continuously performing the processes. This allows to eliminate the time delay between the processes and to suppress the change of the compression stress of the HDP-CVD oxide layer, which may be occurred during the delay.

Figure 1:
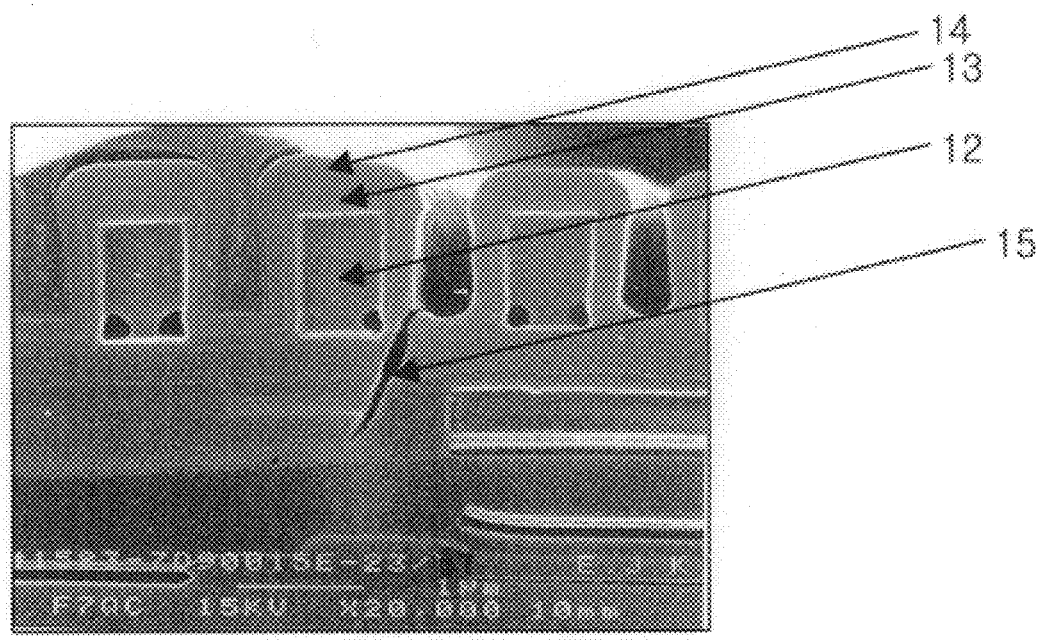
FIG. 1 is a SEM picture showing the state of passivation layers formed according to the prior art.
Figure 6:
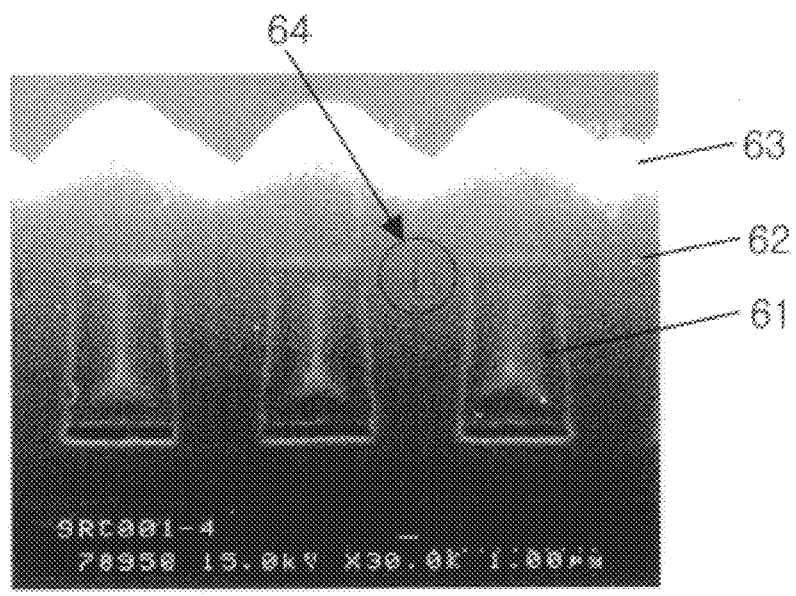
FIG. 6 is a sectional view of the semiconductor device of the first embodiment, which indicates that the situation of the first embodiment should be improved.

FIG. 6 is a SEM picture of a manufactured semiconductor device. Wherein, the height of the metallization layer 61 is 9000 Å, the distance between the metallization layers is 9000 Å, the thickness of the HDP-CVD oxide layer 62 is 8000 Å, and the thickness of the PECVD nitride layer 63 is 3000 Å. The semiconductor device of FIG. 6 has been manufactured with the thickness of the HDP-CVD oxide layer 62 less than the height of the metallization layer 61, but without sufficient bottom coverage required in the first embodiment of the invention as described above, in order to decrease the process time.

As a result, the process for the HDP-CVD oxide layer 62 may result in forming deep seams between the metallization layers and the deep seams is not filled with the PECVD nitride layer 63 thus to produce voids, as shown in FIG. 6.

Accordingly, in the second embodiment of the invention, an HDP-CVD oxide layer is applied as a first passivation layer over a substrate having metallization layers. A nitride layer formed by high-density plasma chemical vapor deposition (simply referred as "HDP-CVD nitride layer) is also applied as a second passivation layer on the HDP-CVD oxide layer. Here, the HDP-CVD oxide layer may be deposited with a thickness of 70~90% or 110~130% based on the height of the metallization layer like as that of the first embodiment of the invention. The second passivation layer is good in gap-filling property like as the first passivation layer.

Because the second passivation layer is deposited by HDP-CVD method like as the first passivation layer, it can fill the seams produced by the first passivation layer, HDP-CVD oxide layer in the second embodiment of the invention.

As a result, the bottom coverage does not need to be sufficiently increased in case of the decreased thickness of the HDP-CVD oxide layer in the second embodiment. Accordingly, this may allow the process time for forming the HDP-CVD to be decreased.

The processes for forming the HDP-CVD oxide layer and the HDP-CVD nitride layer are also continuously performed with the same HDP-CVD equipment only by changing the corresponding source gases. Accordingly, this may allow to suppress the time delay between the two processes.

As described above, it is preferable that the deposition of the HDP-CVD oxide layer should be performed in the first and second embodiments of the invention with the following conditions. As input gases, the flow rate of $SiH_4$ is in the range of 80~120 sccm, that of $O_2$ is in the range of 100~120 sccm, and that of Ar is in the range of 50~450 sccm. Low frequency (LF) power is in the range of 3000~5000 Watt, and high frequency (HF) power is in the range of 2000~3500 Watt. The deposition of the HDP-CVD nitride layer is also performed with $SiH_4$, $N_2$ and/or $NH_3$ and Ar as input gases in the second embodiment of the invention.

Meanwhile, an HDP-CVD oxy-nitride layer may be used instead of the nitride layer in the second embodiment, in order to enhance the ultra-violet ray penetration of the second passivation. Here, the HDP-CVD oxy-nitride layer may be deposited with addition of $O_2$ to the input gases for forming the HDP-CVD nitride layer, that is, $SiH_4$, $N_2$ and/or $NH_3$ and Ar.

While the present invention has been described with respect to certain preferred embodiments only, other modifications and variations may be made without departing from the spirit and scope of the present invention as set forth in the following claims.

What is claimed is:

1. A method for fabricating a semiconductor device which comprises the steps of:

preparing a substrate with completion of metallization;

forming an oxide layer as a first passivation layer over the substrate by high density plasma chemical vapor deposition (HDP-CVD); and forming a nitride layer as a second passivation layer on the oxide layer by plasma enhanced chemical vapor deposition (PECVD), wherein the nitride layer is formed in-situ without breaking vacuum after the oxide is formed.

2. The method according to claim 1, wherein the oxide layer is formed with a thickness of 110~130% based on the height of the metallization layer.

3. The method according to claim 1, wherein the oxide layer is formed with a thickness of 70~190% based on the height of the metallization layer.

4. The method according to claim 1, wherein the oxide layer is formed with a chamber pressure of 1~10 mTorr by HDP-CVD to increase bottom coverage in the space between the metallization layers.

5. The method according to claim 1, wherein the oxide layer is formed by HDP-CVD using $SiH_4$, $O_2$ and Ar as input gases, herein the flow rate of $SiH_4$ is in the range of 80~120 sccm, that of $O_2$ is in the range of 100~120 sccm, and that of Ar is in the range of 50~450 sccm.

6. The method according to claim 1, wherein the PECVD nitride layer has the penetration of more than 70% based on the amount of ultraviolet ray penetration of the same thick silicon oxide layer.

7. A method for fabricating a semiconductor device which comprises the steps of:

preparing a substrate with completion of metallization;

forming an oxide layer as a first passivation layer over the substrate by high density plasma chemical vapor deposition (HDP-DVD); and forming a nitride layer as a second passivation layer on the oxide layer by high density plasma chemical vapor deposition (HDP-CVD), wherein the nitride layer is formed in-situ without breaking vacuum after the oxide is formed.

8. The method according to claim 7, wherein the oxide layer is formed with a thickness of 110~130% based on the height of the metallization layer.

9. The method according to claim 7, wherein the oxide layer is formed with a thickness of 70~90% based on the height of the metallization layer.

10. The method according to claim 7, wherein the oxide layer is formed by HDP-CVD using $SiH_4$, $O_2$ and Ar as input gases, wherein the flow rate of $SiH_4$ is in the range of 80~120 sccm, that of $O_2$ is in the range of 100~120 sccm, and that of Ar is in the range of 50~450 sccm.

11. The method according to claim 7, wherein the nitride layer is formed by HDP-CVD using $SiH_4$, $N_2$ and/or $NH_3$, and Ar as input gases.

12. A method for fabricating a semiconductor device which comprises the steps of:

preparing a substrate with completion of metallization;

forming an oxide layer as a first passivation layer over the substrate by high density plasma chemical vapor deposition (HDP-CVD); and forming an oxy-nitride layer as a second passivation layer on the oxide layer by plasma enhanced chemical vapor deposition (PECVD), wherein the nitride layer is formed in-situ without breaking vacuum after the oxide is formed.

13. The method according to claim 12, wherein the oxide layer is formed with a thickness of 110~130% based on the height of the metallization layer.

14. The method according to claim 12, wherein the oxide layer is formed with a thickness of 70~90% based on the height of the metallization layer.

15. The method according to claim 12, wherein the oxide layer is formed by HDP-CVD using $SiH_4$, $O_2$ and Ar as input gases, wherein the flow rate of $SiH_4$ is in the range of 80~120 sccm, that of $O_2$ is in the range of 100~120 sccm, and that of Ar is in the range of 50~450 sccm.

16. The method according to claim 12, the oxy-nitride layer is formed by HDP-CVD using $SiH_4$, $N_2$ and/or $NH_3$, Ar and $O_2$ as input gases.

* * * * *